United States Patent [19]

Kozono et al.

[11] Patent Number: 5,119,169
[45] Date of Patent: Jun. 2, 1992

[54] SEMICONDUCTOR INTEGRATED CIRCUIT DEVICE

[75] Inventors: Kazuhiko Kozono, Kodaira; Yoshio Shintani, Kokubunji, both of Japan

[73] Assignee: Hitachi, Ltd., Tokyo, Japan

[21] Appl. No.: 506,133

[22] Filed: Apr. 9, 1990

[30] Foreign Application Priority Data

Apr. 10, 1989 [JP] Japan ................................. 1-89991

[51] Int. Cl.⁵ ..................... H01L 23/48; H01L 27/02; H01L 27/10; H01L 29/46
[52] U.S. Cl. ......................................... 357/68; 357/40; 357/45; 357/71
[58] Field of Search ........................ 357/40, 45, 71, 68

[56] References Cited

FOREIGN PATENT DOCUMENTS 63-152163  6/1988  Japan .

OTHER PUBLICATIONS

1986 IEEE International Solid-State Circuits Conference; Feb. 19, 1986, pp. 78-79 & 313.
1988 IEEE International Solid-State Circuits Conference; Feb. 17, 1988, pp. 72-73 & 307.

Primary Examiner—Mark Prenty
Attorney, Agent, or Firm—Pennie & Edmonds

[57] ABSTRACT

In a semiconductor integrated circuit device produced in a master slice system, power source wirings are placed over the peripheral portion of a basic cell array and auxilliary power source wirings are extended over the basic cell array. A first power source wiring is supplied with a first power source voltage and a second power source wiring supplied with a second power source voltage, both thereof being located adjacent to the basic cell array, and are both formed on separate layers one above the other so as to overlap and parallel each other. The auxiliary power source wirings are formed one above the other, in the same wiring layers as the first power source wiring and the second power source wiring. A third power source wiring and a fourth power source wiring are disposed in the same wiring layers as the first power source wiring and the second power source wiring, so as to be juxtaposed with the first power source wiring and the second power source wiring, respectively. The third power source wirings and the fourth power source wirings are arranged to overlap and parallel each other. The first power source wiring and the fourth power source wiring are supplied with the same first power source voltage while the second power source wiring and the third power source wiring are supplied with the same second power source voltage.

22 Claims, 6 Drawing Sheets

SEMICONDUCTOR INTEGRATED CIRCUIT DEVICE

BACKGROUND OF THE INVENTION

The present invention relates to an art to effectuate optimal layout of power source wirings of semiconductor devices produced in a master slice semiconductor integrated circuit development system.

The master slice system is used for producing a custom-made Large Scale Integrated Circuit Chip (LSI) LSI in a short delivery time. According to this system, a plurality of basic cells are regularly arranged on a semiconductor substrate in advance. The basic cells are then interconnected with signal wirings to implement the desired logic and produce an LSI that meets the user's requirements.

In IC devices having a multilayer structure such as those produced in the master slice system, power supplied from outside the IC is distributed throughout the IC device through a pair of power source wirings. One of the pair of power $V_{cc}$ source wirings a is supplied with high level voltage through an external power source device terminal and the other is supplied through an external power source terminal with a low level $V_{ss}$.

Bonding pads are disposed at the peripheral portion of the semiconductor integrated circuit device's bonding pads are disposed for electrically connecting the devices logic circuits to outside devices through I/O cells. The I/O cells can selectively serve as input/output buffer circuits, output buffer circuits, input buffer circuits, and input/output buffer circuits. Above the I/O cells, on another wiring layer, a pair of power source wirings are formed. This pair of power source wirings, place over the I/O cells around peripheral portion of the IC, is termed as the "power source line".

In the interior region (cell region) of the IC, surrounded by the I/O cells, a plurality of basic cells are formed in a regular layout arrangement. In a wiring layer on the first layer above the basic cell array, are formed power source wirings for supplying power to each basic cell. This power source wiring for supplying power to the basic cell is termed as "cell power source wiring".

An example of a master slice system is described in the ISSCC DIGEST OF THE TECHNICAL PAPERS, PP. 78-79, February, 1986.

In semiconductor IC's produced by a master slice system, the number of gates per unit area is tending to increase. This increased gate density requires a proportional increase in gate power source current density within the basic cell array. To accommodate this requirement for the semiconductor IC's produced in the master slice system, it is the practice to place power source wirings over the peripheral portion of the basic cell array and place auxiliary power source wirings over the interior of the basic cell array.

The auxiliary power source wirings, by moderating current density, tend to reduce the adverse effect of electro-migration and thereby improve the electric reliability of the semiconductor IC. An example of the art to place such auxiliary power source wirings is disclosed in Japanese Laid-open Patent Publication No. 63-152163.

The present inventor has found that the following problems occur in semiconductor IC's produced in the above described master slice system:

Aluminum (Al) has been the wiring material of choice for the integrated circuits formed on a semiconductor or substrate, because it is adhesive to the silicon oxide film and easily workable. However, as the wiring becomes finer due to the increase in the packaging density of integrated circuits, the adverse effect of electro-migration has become so significant that it has become a frequent cause of breakage in the aluminum wiring. The electro-migration is a phenomenon by which the material of the wiring becomes mobile after exchanging momentum with the carriers. As a result of high current density in the wiring the phenomenon becomes more active. Hereinafter, the breakage of a wiring due to the electro-migration is referred to as "EMD" (electro-migration damage).

Further, in the semiconductor IC produced in the master slice system, power from outside the IC is supplied to the cell region through the power source lines formed over the peripheral portion of the IC's substrate. Therefore the current density in the power source lines at the peripheral portion becomes high. Therefore, measures must be taken to prevent EMD of such power source lines. One means is to improve the EMD resistance of the power source line is to widen the power source line so as to decrease the current density. However, as power source lines are widened their area increases. Therefore, in order to achieve high gate density in the semiconductor IC, the width of the power source line cannot be enlarged beyond a certain limit.

The I/O cell of the IC device produced by the master slice system may be constructed of a complementary MISFET (Metal-Insulator-Semiconductor-Field-Effect-Transistor) having a high driving capacity. Power to the I/O cell is supplied from the power source line. When the I/O cells perform switching operations to supply high voltage $V_{cc}$ to the cell region, currents for driving the capacitive load of cell region elements and the signal wiring capacitance are supplied to the I/O cells from the power source lines. Furthermore, when a number of I/O cells simultaneously make switching operations, a large amount of current is required through the power source lines. However because of the limited current carrying capacity of the power source lines, the voltage potential of the power source lines drops temporarily, which is not desirable. Also, when the I/O cells perform switching operations to supply interior cells with low level signals, corresponding to the ground potential $V_{ss}$, charges stored in the capacitive load flow into the ground potential $V_{ss}$ power source lines through the I/O cells. When these operations are simultaneously performed by a large number of I/O cells, a large amount of current is caused to flow through the power source lines. However, since there is a limit in their current pulling capacity, the potential of the $V_{ss}$ power source lines rises temporarily, which is also undesirable. Furthermore, there is an instant in the course of the switching operation in which both the n-channel MISFET and the p-channel MISFET are simultaneously turned on. In this instant, a through-current flows from the $V_{cc}$ power source line to the power source line supplying the ground potential $V_{ss}$. When a large number of I/O cells make simultaneous switching operations, a very large amount of through-current flows for that instant, thereby causing undesired changes in both the power source voltage $V_{cc}$ and ground potential $V_{ss}$.

Such transient changes in potential of the power source lines result in power source noises. This noise has risk of causing malfunctions in the transistors that constitute the logic circuits. For example, when the potential of a $V_{ss}$ power source line to an n-channel MISFET is undesirably raised by this transient noise the source voltage of that n-channel MISFET is raised and the potential difference between its gate electrode and its source electrode is relatively lowered. A result is that when the n-channel MISFET should be in on state, it may instead be temporarily turned off or have its conductance lowered. An analogous malfunction can occur with the p-channel MISFET supplied with the power source voltage $V_{cc}$.

The auxiliary power source wirings over an IC device in the master slice system are formed side by side in the same wiring layer. When the auxiliary power source wirings are formed in a lattice, the auxiliary power source wirings at the crossing point must be three-dimensionally arranged using two wiring layers to prevent occurrence of short-circuiting therebetween. Also at the positions where the auxiliary power source wirings connect to the power source lines formed at the peripheral portion, three dimensional arrangements must be made to avoid short-circuiting. This complicates the design and increases the time for developing the IC device that is produced in the master slice system.

SUMMARY OF THE INVENTION

In view of the aforesaid problems, an object of the present invention is to provide a semiconductor integrated circuit device comprising power source wirings with improved EMD resistance.

Another object of the present invention is to enable semiconductor integrated circuit devices produced in a master slice system to have reduced risk of malfunction due to power source noises and to have improved operating stability.

A further object of the present invention is to achieve the aforesaid objects while additionally facilitating the layout of the device's auxiliary power source wirings.

A still further object of the present invention is to achieve the above enumerated objects and, in addition, to achieve automatic placement of the auxiliary power source wirings by means of an automatic placement and routing system so as to shorten the development time of a semiconductor integrated circuit device produced in the master slice system.

The foregoing and other objects and novel features of the present invention will be more fully understood from the description given hereinbelow and the accompanying drawings.

Representative aspects of the invention disclosed herein will be summarized by the example below.

The semiconductor IC device of this example is formed in a multilayer structure having a first power source wiring supplied with a first power source voltage and a second power source wiring supplied with a second power source voltage, with the two wirings placed on different layers.

The first power source wiring and the second power source wiring are placed on adjoining separate layers, one above the other, so as to overlap each other in a parallel fashion.

Further, a third power source wiring and a fourth power sources wiring are placed in the same adjoining layers as the other on which the first power source wiring and the second power source wiring are placed. The arrangement is such that the third power source wiring and the fourth power source wiring are respectively juxtaposed with the first power source wiring and the second power source wiring, while the third power source wiring and the fourth power source wiring also overlap each other in a parallel fashion. The first power source wiring and the fourth power source wiring are supplied with the first power source voltage, while the second power source wiring and the third power source wiring are supplied with the second power source voltage.

Further, there are auxiliary power source wirings arranged having first auxiliary power source trunk lines supplied with the first power source voltage extended from the first power source wiring, and second auxiliary power source trunk lines supplied with the second power source voltage extended from the second power source wiring.

With the above mentioned wiring means, by the placement of the first power source wiring and the second power source wiring on separate layers, the pair of power source wirings are placed one above and overlapping the other, at least in part, with a predetermined insulating distance therebetween. As a result, each of the power source wirings can be formed wider than was practical in the prior art. Thus, the current density in the power source wiring can be reduced so as to improve the EMD resistance and as a result the electric reliability on the semiconductor integrated circuit device can be enhanced.

By the arrangement of placing the first power source wiring and the second power source wiring on separate layers with a predetermined insulating distance between them, the prior art requirement for having the power source wirings three-dimensionally crossed at the crossing point can be eliminated and, hence, designing of the power source wirings becomes easier.

Furthermore, the placement of the first power source wiring and the second power source wiring on adjoining separate layers one above the other so as to overlap each other, a greater coupling capacitance is produced coupling between the pair or power source wirings than in the prior art. Since such coupling capacity works to relax or absorb transient changes in the potential of the power source wirings due to power source noises, malfunctions of the IC device can be prevented and its electric reliability can be enhanced.

According to the above described wiring means, different power source wirings, independently supplied with the first power source voltage and the second power source voltage, are included in the same power source wiring layer. Therefore, it becomes easier to supply power to elements disposed directly below or above the power source wirings. Further, since the power source wirings which are located at one side of the aforesaid power source wirings, with one above and overlapping the other, are also arranged to have different power source voltage, power supply from the auxiliary power source trunk lines to circuit elements formed at the side of the power source wirings becomes easier. Thus, the time for developing the semiconductor integrated circuit device produced in the master slice system can be shortened.

The structure of the present invention will be described below the relation to an embodiment, to which the present invention is applied, of a semiconductor integrated circuit device having a sea-of-gates array and produced in a master slice system.

Throughout the drawings for explaining the embodiment, parts having corresponding functions will be denoted by corresponding reference numerals and repeated explanation thereof will be omitted.

In regard to the sea-of-gates array, there is a description in, for example, ISSCC DIGEST OF TECHNICAL PAPERS, pp. 72-73, February, 1988.

DESCRIPTION OF THE PREFERRED EMBODIMENTS

Embodiment 1

Figure 1:
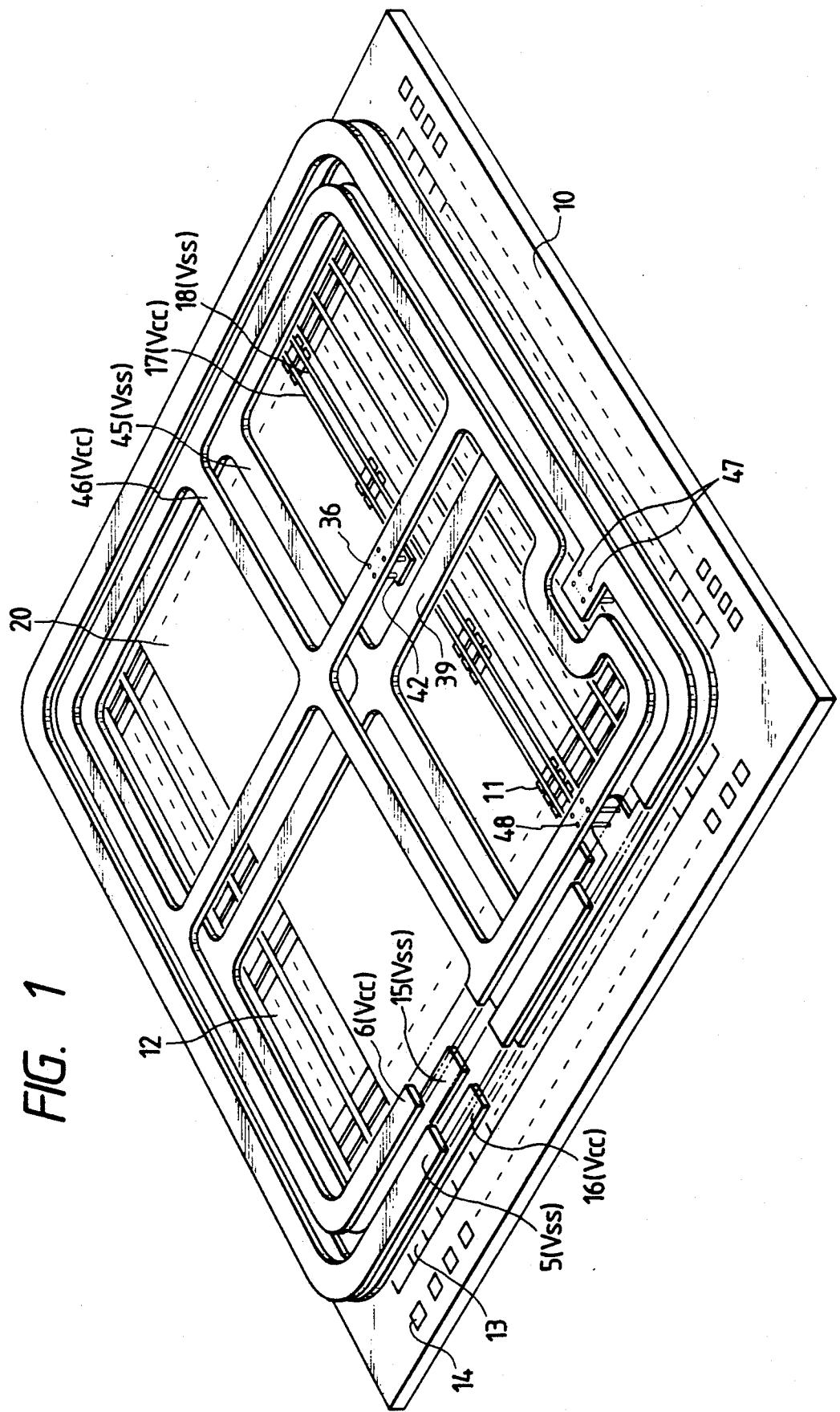
FIG. 1 is a schematic structural drawing of a semiconductor integrated circuit device as an embodiment of the present invention.

FIG. 1 schematically shows as an embodiment of the present invention a basic structure of a semiconductor device of a sea-of-gates array produced in a master slice system. In the drawing, underlayer insulating films are not shown for simplicity of explanation.

The semiconductor integrated circuit device shown in FIG. 1 has a three-layer structure, for example, and though not limited to such, it is a CMOS gate array having each of its gates formed of a complementary MISFET (CMOS). The CMOS structure includes one of each of a p-channel MISFET and an n-channel MISFET, regularly arranged on the surface of a semiconductor substrate (silicon single-crystalline chip) 10 in its central portion. The gate is a basic element of the logic circuit and therefore is termed a basic cell 11. Having multiple basic cells 11 aligned in the direction of the column, a column of cells 12 is formed, and by having multiple columns of cells 12 arranged in the direction of the row, a cell region 20 is formed.

The CMOS gate array of the present embodiment 1 is such that the basic cells 11 are completely arranged in a cell region 20, and is therefore called a "sea of gates" array. With this type of cell arrangement there is no wiring channel region between columns of cells as in the so-called fixed channel system. By providing connections within the basic cell 11 and between other basic cells 11 with signal wirings, not shown, a desired logic circuit is formed. The signal wiring is formed in a wiring layer made of aluminum alloy placed, for example, on the first layer. The line width of the signal wiring is, for example, 2 to 4 μm. Also, in the wiring layer on the first layer, there are formed a pair of cell power source wirings 17 and 18 made of aluminum alloy for supplying power to the basic cells 11 along each of the columns of cells 12. The width of the cell power source wirings 17 and 18 is, for example, 6-10 μm.

Around the cell region 20, there are formed a sequence of I/O cells, selectively used as an input buffer, an output buffer, and an input/output buffer, and on the circumference of the substrate 10 outside the I/O cells 13, there are disposed bonding pads 14 for providing electric connections between the device and the outside. The I/O cells 13 are formed of complementary MISFETs and becomes the input buffer, the output buffer, and the input/output buffer by being connected by the wirings in the wiring layer on the first layer, for example. Further, the I/O cells 13 provide a circuit for preventing electrostatic breakdown or serving as a clamp circuit. Some of the plurality of bonding pads 14 are external power source terminals for receiving power supply from outside the device, and these external power source terminals are supplied with power voltage $V_{cc}$ (e.g., 5 V) or ground potential (e.g., 0 V).

In the wiring layer above the I/O cells 13 on for example, the second layer, there are a formed power source lines 15 and 16, made of aluminum alloy, side by side for transmitting power supplied to the external power source terminals to the cell region 20. One power source line 15 is disposed on the side facing the cell region 20 and supplied with the ground potential $V_{ss}$ from the external power source terminal. The other power source line 16 is disposed outside the power source line 15 and supplied with the power source voltage $V_{cc}$ from the external power source terminal. Since the power source lines 15 and 16 are disposed in the same wiring layer side by side, electric connections of the same with the I/O cells 13 are easily performed.

In the wiring layer above the power source lines 15 and 16 on, for example, the third layer, there are formed power source lines 5 and 6, made of aluminum alloy, side by side. The width of the power source lines 5 and 6 are virtually the same as the width of the power source lines 15 and 16 disposed thereunder. One power source line 5 is disposed above, parallel with, and overlapping the power source line 16, while the other power source line 6 is disposed above, parallel with and overlapping the power source line 15. The power source line 5 is formed such that its portions at a prescribed several positions are projected directly above the power source line 15, which is disposed at an angle below the power source line 5, and the power source line 5 is electrically connected with the power source line 15 thereunder through a plurality of contact holes 47 made in an insulating film, not shown, directly under the projected portions. By this method the power source line 5 is supplied with the ground potential $V_{ss}$. Around the projected portions of power source line 5, adjoining power source line 6 is curvedly formed to provide clearance. The power source line 16 is formed such that its portions of prescribed several positions are projected directly below the power source line 6, which is disposed at an angle above the power source line 16, and the power source line 16 is electrically connected with the power source line 6 above the same through a plurality of contact holes 48 made in an insulating film, not shown. By this method, the power source line 6 is supplied with the power source voltage Vcc. In the drawing, the projected portions of each power source line are represented only by one position. Although the power source lines 5, 6, 15, and 16 are formed continuously along the circumferential portion of the substrate 10, some of their portions are shown cut away so that it is easily understood that they are disposed one above and overlapping the other.

Furthermore, it is to be understood that the power source lines 5, 6, 15, and 16, are generally formed of a plurality of juxtaposed wirings approximately 45 μm wide, for example, to avoid occurrence of package cracks during the packaging process, and are shown as one wiring in the drawing for simplicity. The plurality of wires forming the power source line 15 are supplied with power from the I/O cell 13 which is supplied with the ground potential $V_{ss}$, and the plurality of wires forming the power line 16 are supplied with power from the I/O cell 13 which is supplied with the power source voltage $V_{cc}$.

On the layers above the cell region 20 surrounded by the power source lines 5, 6, 15, and 16, there are formed auxiliary power source trunk lines 45 and 46 made of aluminum alloy. These lines 45 and 46 provide electric connections between the cell power source wirings 17 and 18 and the power source line 15 and 16. One auxiliary power source trunk line 45 is formed in the wiring layer on the second layer together with the power source line 15, and its end portions are integrally connected with the power source line 15. By this method, the auxiliary power source trunk line 45 is supplied with the ground potential $V_{ss}$. The line width of the auxiliary power source trunk line 45 is 15 to 25 μm, for example. The other auxiliary power source trunk line 46 is formed in the wiring layer on the third layer, the same as the power source line 6, and its end portions are integrally connected with the power source line 6, to supply the trunk line 46 with the power source voltage $V_{cc}$. The line width of the auxiliary power source trunk line 46 is 20 to 50 μm, for example. Both the auxiliary power source trunk lines 45 and 46 are formed of a plurality of lines arranged in a lattice form. The auxiliary power source trunk lines 45 and 46 are disposed in parallel, not overlapping each other but in an uneven parallel manner with a predetermined distance therebetween.

Figure 2:
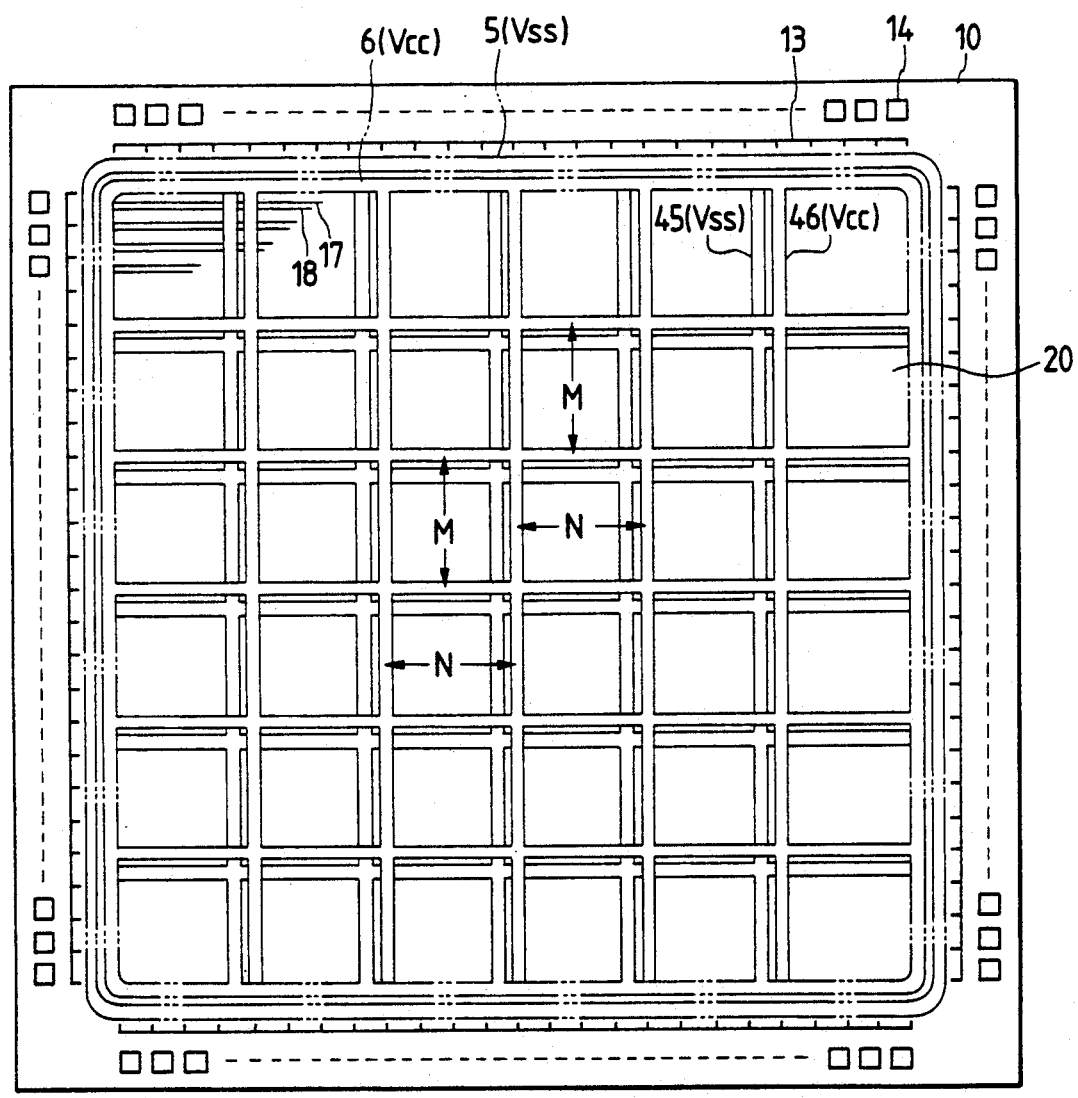
FIG. 2 is a schematic plan view of a semiconductor substrate showing placement of power source lines in the semiconductor integrated circuit device.
Figure 3:
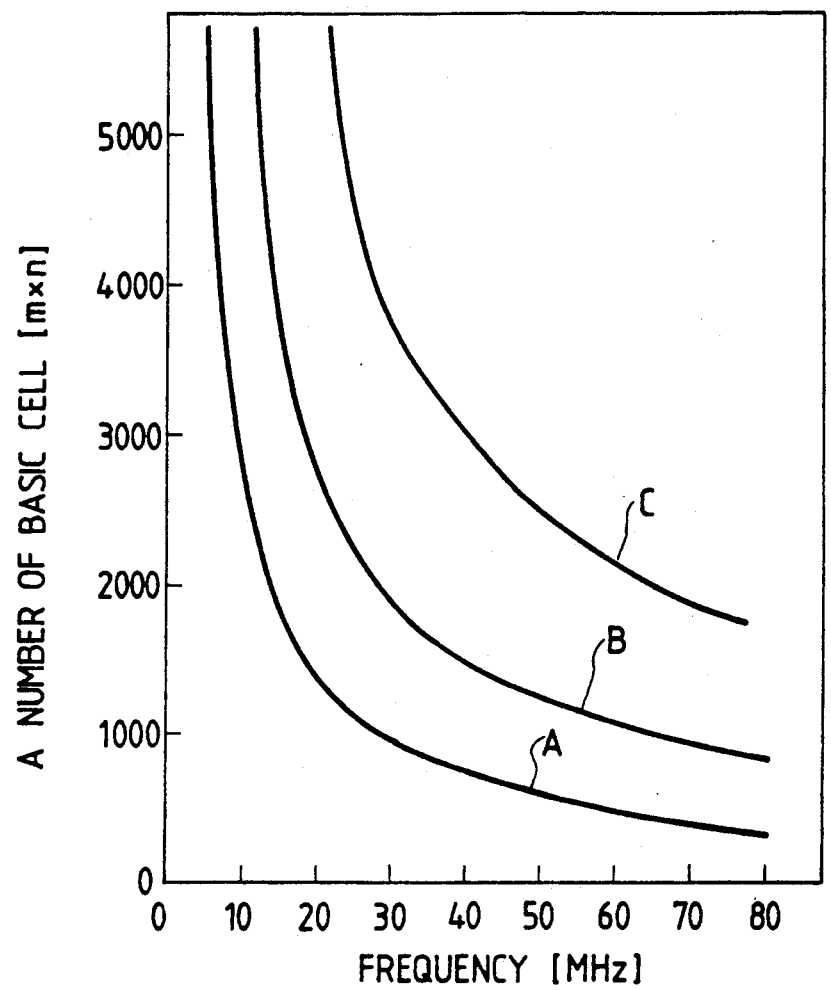
FIG. 3 is a graph showing relationships between the number of basic cells, frequency used, and the current density in the semiconductor integrated circuit device.

FIG. 2 shows the arrangement of the auxiliary power source trunk lines 45 and 46 in more detail. The number of arranged auxiliary power source trunk lines 45 and 46 and their wiring sizes (line width and film thickness) are automatically set according to base data in an automatic placement and routing system, which is described later in detail. In specific, the spacing M and the number of lines in the direction of the row, as well as the spacing N and the number of lines in the direction of the column, of the power source trunk lines 45 and 46 are determined based on the number of the basic cells 11, using the IC's intended switching frequency and wiring sizes as the chief parameters. FIG. 3 shows examples of relationships between the frequencies used and the number of basic cells. Referring to the graph, the abscissa represents the frequencies used [MHz] and the ordinate represents the number of the basic cells 11 (the product of the number of the basic cells 11 arranged in the direction of the row [m] and the number of the basic cells 11 arranged in the direction of the column [n]). The curves A, B, and C in the graph correspond to the total sectional area [μm$^2$] of the auxiliary power source trunk lines 45 and 46, i.e., the sum total of the sectional area of the auxiliary power source trunk line 45 and the sectional area of the auxiliary power source trunk line 46. In the example shown the curve A represents the case where the total sectional area of the auxiliary power source trunk lines 45 and 46 is 22 to 23 m$^2$. The curve B represents the example case where the total sectional area of the auxiliary power source trunk lines 45 and 46 is 35 to 36 μm$^2$. The curve C represents the example case where the total sectional area of the auxiliary power source trunk lines 45 and 46 is 61 to 62 μm$^2$. Since the optimum current density of the one basic cell 11 can be measured, the number of basic cells 11 and the total sectional area required for the auxiliary power source trunk lines 45 and 46 for the basic cells 11 of that number can be obtained from FIG. 3.

For example, when the frequency to be used is 30 MH$_z$ and the total sectional area of the auxiliary power source trunk lines 45 and 46 is assumed to be 22 to 23 μm$^2$ (curve A), then the number of the basic cells 11 providing the optimum current density is about 1,000. Since the number of the basic cells 11 is the product of the number of the basic cells 11 arranged in the direction of the row [m] and the number of the basic cells 11 arranged in the direction of the column [n], it will be well if, for example, one each of the auxiliary power source trunk lines 45 and 46 are provided for 10 each of the basic cells 11 arranged in the direction of the row and one each of the auxiliary power source trunk lines 45 and 46 are provided for 100 each of the basic cells 11 arranged in the direction of the column. In the present embodiment, one each of the auxiliary power source trunk lines 45 and 46 are prepared for about 10 to 20 each of the basic cells 11 arranged in the direction of the row and one each of the auxiliary power source trunk lines 45 and 46 are prepared for about 100 to 200 each of the basic cells 11 arranged in the direction of the column. Thereby, the number of the basic cells 11 arranged in a region defined by the auxiliary power source trunk lines 45 and 46 extended in the direction of the row and the auxiliary power source trunk lines 45 and 46 extended in the direction of the column becomes virtually equal to the number of the basic cells 11 arranged in another defined region. Also, the current density in each of the defined regions becomes virtually equal. Since the current density is set up optimally based on the number of basic cells 11 in each of the regions defined by the auxiliary power source trunk lines 45 and 46, there occurs no extreme concentration of current density, whatever logic circuits may be designed. In the region defined as described above, the rate of utilization of the basic cells 11 (the rate of the established logic circuits) need not always be 100%. 20% of overhead margin is generally allowed, and 80% utilization rate is average.

Thus, by arranging the auxiliary power source trunk lines 45 and 46 extended in the direction of the column at intervals of a substantially equal spacing M in the direction of the row, and by arranging the auxiliary power source trunk lines 45 and 46 extended in the direction of the row at intervals of a substantially equal spacing N in the direction of the column in a lattice form on the layers above the cell region 20 of the semiconductor IC device produced in the master slice system, the current densities in all regions defined by the auxiliary power source trunk lines 45 and 46 become equal. Therefore, it is made possible to optimize the number of arranged auxiliary power source trunk lines 45 and 46 and the wiring size according to the current density in each of the defined regions. This reduces the wasteful areas occupied by the auxiliary power source trunk lines 45 and 46, thereby improving the density of the logic circuits.

As shown in FIG. 1, one cell power source wiring 17, of a pair of cell power source wirings 17 and 18 formed on the layer above the column of cells 12, is disposed above the p-channel MISFETs of the basic cells 11 forming the column of cells 12 and connected with the auxiliary power source trunk line 46 through a pad electrode 42 formed in the wiring layer on the second layer and a plurality of contact holes 36 made in an interlayer insulating film, not shown. The other cell power source wiring 18 is disposed above the n-channel MISFETs of the basic cells 11 and connected with the auxiliary power source trunk line 45 through a plurality of contact holes 39 made in an interlayer insulating film, not shown. Hence, the power source wiring 17 is supplied with the power source voltage $V_{cc}$ and the power source wiring 18 is supplied with the ground potential $V_{ss}$. Thus, in the CMOS gate array of the present embodiment 1, power is supplied from the power source lines 5, 6, 15, and 16 formed above the I/O cells 13 to the auxiliary power source trunk lines 45 and 46 and, further, through the cell power source wirings 17 and 18, to the cell region 20.

The current supply function is distributed between power source lines 5, 6, 15, and 16 and therefore only they can be formed smaller in width than power source lines in the prior art which have been formed side by side in the same wiring layer, but are at least one half of the width of prior art power source lines. Owing to the reduced width of each of the power source lines 5, 6, 15, and 16 compared to that of the prior art, the area occupied by them can be reduced and, hence, the semiconductor IC device of the present embodiment 1 achieves improved cell density over the prior art. Further, since the power source line 5 and 15, as well as the power source lines 6 and 16, formed on two layers one over the other are each supplied with the same potential and each power source line has a width larger than one half of that of the prior art power source line, the total width of the power source lines having the same potential is formed to be larger than that in the prior art. Consequently, the IC device of the present embodiment 1 has a lower power source line current density than the prior art which yields improved EMD resistance.

In the prior art, where power source lines are formed side by side in the same wiring layer, the coupling capacitance between the power source lines was only that between side faces of the two power source lines. In the present embodiment 1, in addition to the coupling capacitance between the side faces of the power source lines 5 and 6, as well as 15 and 16, formed side by side in the same wiring layers and, there is significant coupling capacitance between the power source lines 5 and 16, as well as 6 and 15, which are formed with one above and overlapping the other. Actually, because of the doubling of peripheral area resulting from two sets of power source lines, the coupling capacity produced between the side faces of the power source lines 5, 6, 15, and 16 is increased to two times of that in the prior art, which in addition to the coupling capacitance produced between the respective top and bottom surfaces of the power source lines 5, 6, 15, and 16 yield c coupling capacity produced by the power source line 5, 6, 15, and 16 much larger than that in the prior art.

When a plurality of I/O cells 13 connected to power source lines 5, 6, 15, and 16 make switching operations at the same time, power source noises are produced in the power source lines 5, 6, 15, and 16. However, the present invention's increased coupling capacity described above acts to alleviate the noises. More particularly, when the power source noises occur, the potential of the power source lines 5, 6, 15, and 16 tends to rise or fall undesirably, but in the present embodiment if the ground potential $V_{ss}$ of the power source lines 5 and 15 tends to rise undesirably, then the excessive charges must first charge the increased coupling capacity, and if the power source voltage $V_{cc}$ of the power source line 6 and 16 tends to fall undesirably, the charges used for charging the increased coupling capacity compensate for the voltage drop. By such alleviation of the undesirable changes in the potential of the power source lines 5, 6, 15, and 16, the semiconductor integrated circuit device of the present embodiment 1 prevents noise induced malfunctions of the transistors in the cell region 20, thereby assuring stabilized operation of the circuit. Thus, the electric reliability of the IC device is enhanced.

The power source lines 6 and 15 disposed toward the cell region 20 to face thereon are formed on separate layers one over the above and supplied with the power source voltage $V_{cc}$ and ground potential $V_{ss}$, respectively. In supplying power to the cell region 20, the auxiliary power source lines 46 and 45 are formed on separate wiring layers, each being on the same layer as the power source lines 6 and 15, respectively. Hence, the degree of freedom in the design of the auxiliary power source trunk lines 46 and 45 can be increased. Therefore, the development time of a semiconductor integrated circuit device produced in the master slice system employing an automatic placement and routing system can be shortened. The reason is that if a pair of the auxiliary power source trunk lines and a pair of the power source lines, each pair being supplied with the power source voltage $V_{cc}$ and the ground potential $V_{ss}$, are formed in the same wiring layer on each layer, it becomes necessary to provide a three-dimensional wiring arrangement at the connecting portion of the auxiliary power source trunk line and the power source line to prevent short-circuiting between them. In addition, the area in each layer to extend the signal lines is decreased, and therefore, the degree of freedom in the design is lowered.

Figure 4:
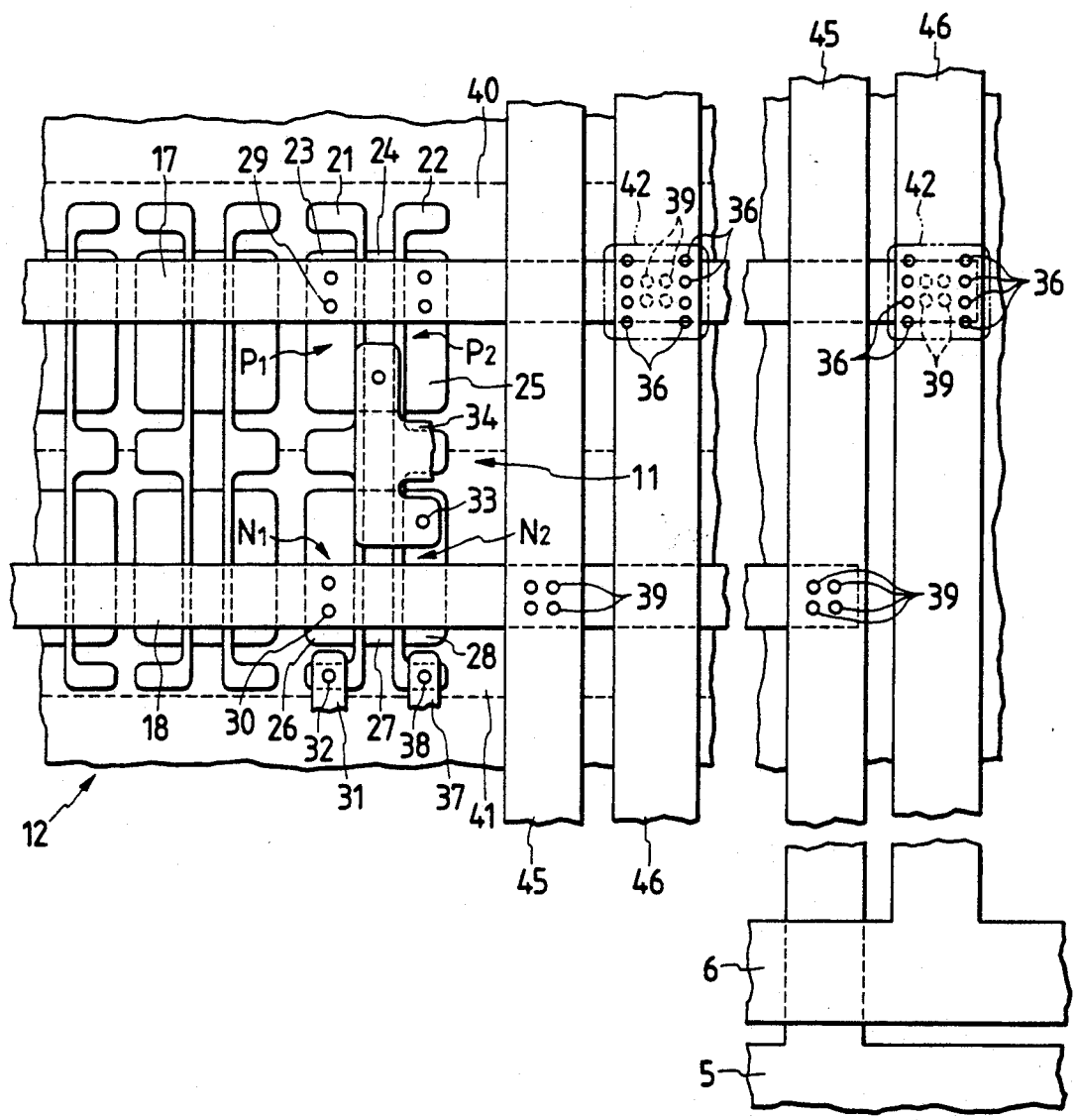
FIG. 4 is a partially enlarged plan view showing a circuit configuration formed in the cell region of the semiconductor integrated circuit device.

In FIG. 4 is shown a detailed drawing of the basic cell 11, the cell power source wirings 17 and 18, and the auxiliary power source trunk lines 45 and 46 shown in FIG. 1. The basic cell 11 is formed of a complementary MISFET (CMOSFET) including two p-channel MISFETs ($P_1, P_2$) formed on an n-type well region 40 and two n-channel MISFETs ($N_1, N_2$) formed on a p-type well region 41. The p-channel MISFETs ($P_1, P_2$) are made up of three juxtaposed p-type semiconductor regions 23, 24, and 25, of which one p-channel MISFET ($P_1$) is made up of the p-type semiconductor region 24 located in the center of the aforesaid p-type semiconductor regions and the p-type semiconductor region 23 located at one side of the p-type semiconductor regions, and the other p-channel MISFET ($P_2$) is made up of the p-type semiconductor region 24, which is also a constituent of the p-channel MISFET ($P_1$), and the p-type semiconductor region 25 located at the other end of the aforesaid p-type semiconductor regions. The n-channel MISFETs ($N_1, N_2$) are made up of three juxtaposed n-type semiconductor regions 26, 27, and 28, of which one n-channel MISFET ($N_1$) is made up of the n-type semiconductor region 27 located in the center of the aforesaid n-type semiconductor regions and the n-type semiconductor region 26 located at one side of the n-type semiconductor regions, and the other n-channel MISFET ($N_2$), is made up of the n-type semiconductor region 27, which is also a constituent of the n-channel MISFET ($N_1$), and the n-type semiconductor region 28 located at the other end of the aforesaid n-type semiconductor regions. The MISFETs ($P_1$, $N_1$) are provided with a common gate electrode 21 and likewise the MISFETs ($P_2$, $N_2$) are provided with a common gate electrode 22.

On the layer above the column of cells 12 made up of a plurality of basic cells 11, there are disposed cell power source wirings 17 and 18 running along the column of cells 12 and connected with the auxiliary power source trunk lines 45 and 46. The cell power source wirings 17 and 18 are formed in the wiring layer on the first layer.

One cell power source wiring 17 is connected with the auxiliary power source trunk line 46 through the pad electrode 42 formed during the wiring forming process of the second layer. The auxiliary power source trunk line 46 is connected with the pad electrode 42 through a plurality of contact holes 36 made in an inter-layer insulating film, not shown, and the pad electrode 42, in turn, is connected with the cell power source wiring 17 through a plurality of contact holes 36 made in an inter-layer insulating film, not shown. The pad electrode 42 is adapted to have the line width larger than the auxiliary power source trunk line 46 and the line width larger than the cell power source wiring 17, or preferably larger than the auxiliary power source trunk line 45. Furthermore, the cell power source wiring 17 is connected with the p-type semiconductor region 23 through contact holes 29 made in an inter-layer insulating film, not shown. The other power source line 18 is connected with the auxiliary power source trunk line 45 through a plurality of contact holes 39 made in the inter-layer insulating film, not shown, and connected with the n-type semi-conductor region 26 through contact holes 30 made in the inter-layer insulating film, not shown. Reference to the method in such a three-layer structure as described above for connecting auxiliary power source trunk lines with cell power source lines through contact holes, a disclosure is made, for example, in U.S. patent application Ser. No. 450,897 filed on Dec. 14, 1989, and the contents thereof are hereby incorporated herein by reference.

By adding, for example, signal wirings 31, 34, and 37 and contact holes 29, 30, 32, 33, and 38 to the basic cell 11 shown in the drawing, a two-input NAND circuit is formed. The cell power source wiring 17 is connected with the p-type semiconductor regions 23 and 25 through the contact holes 29, while the cell power source wiring 18 is connected with the n-type semiconductor region 26 through the contact holes 30. In order to input signals to the two-input NAND circuit, the signal wiring 31 connected with the gate electrode 21 through the contact hole 32 is formed and the signal wiring 37 connected with the gate electrode 22 through the contact hole 38. Further, for transmitting the signal output from the two-input NAND circuit to another circuit, there is formed the signal wiring 34, which is connected with the p-type semiconductor region 24 and the n-type semiconductor region 28 through the contact holes 33.

The contact holes 29, 30, 33, 36, 39, 47, and 48 are formed to be virtually the same size. When a 0.8 [$\mu m$] production process is employed, they are formed in the size of $0.8 \times 0.8$ [$\mu m^2$].

Figure 5:
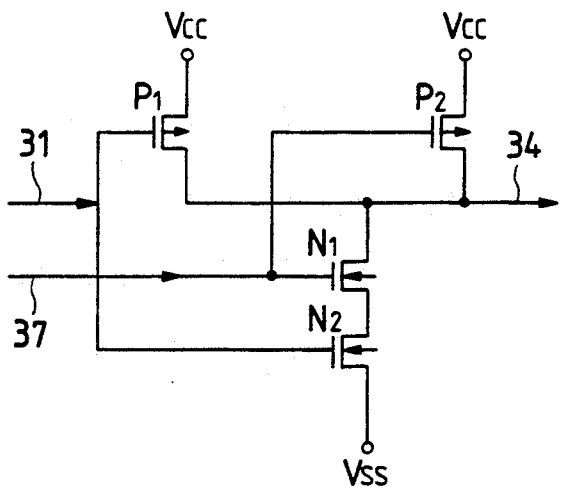
FIG. 5 is an equivalent circuit diagram of the portion including the basic cell shown in FIG. 4.

FIG. 5 shows an equivalent circuit to the two-input NAND circuit. The two-input NAND circuit is formed of a combination of two p-channel MISFETs ($P_1$, $P_2$) connected in parallel and two n-channel MISFETs ($N_1$, $N_2$) connected in series. If both the signal wirings 31 and 37 are simultaneously turned to a high level, the p-channel MISFETs ($P_1$, $P_2$) are brought to an off state and the n-channel MISFETs ($N_1$, $N_2$) are brought to an on state and, hence, the signal line 34 is brought to a low level. Then, if either one of the signal lines 31 and 37 is turned to low level and the other is held at high level, either one of the p-channel MISFETs ($P_1$, $P_2$) is brought to an on state, whereby the signal line 34 is brought to high level. Further, if both the signal lines 31 and 37 are turned to low level, both of the p-channel MISFETs ($P_1$, $P_2$) are brought to an on state, whereby the signal line 34 is brought to high level. Thus, the two-input NAND circuit performs an operation of negating a logical product.

Figure 6:
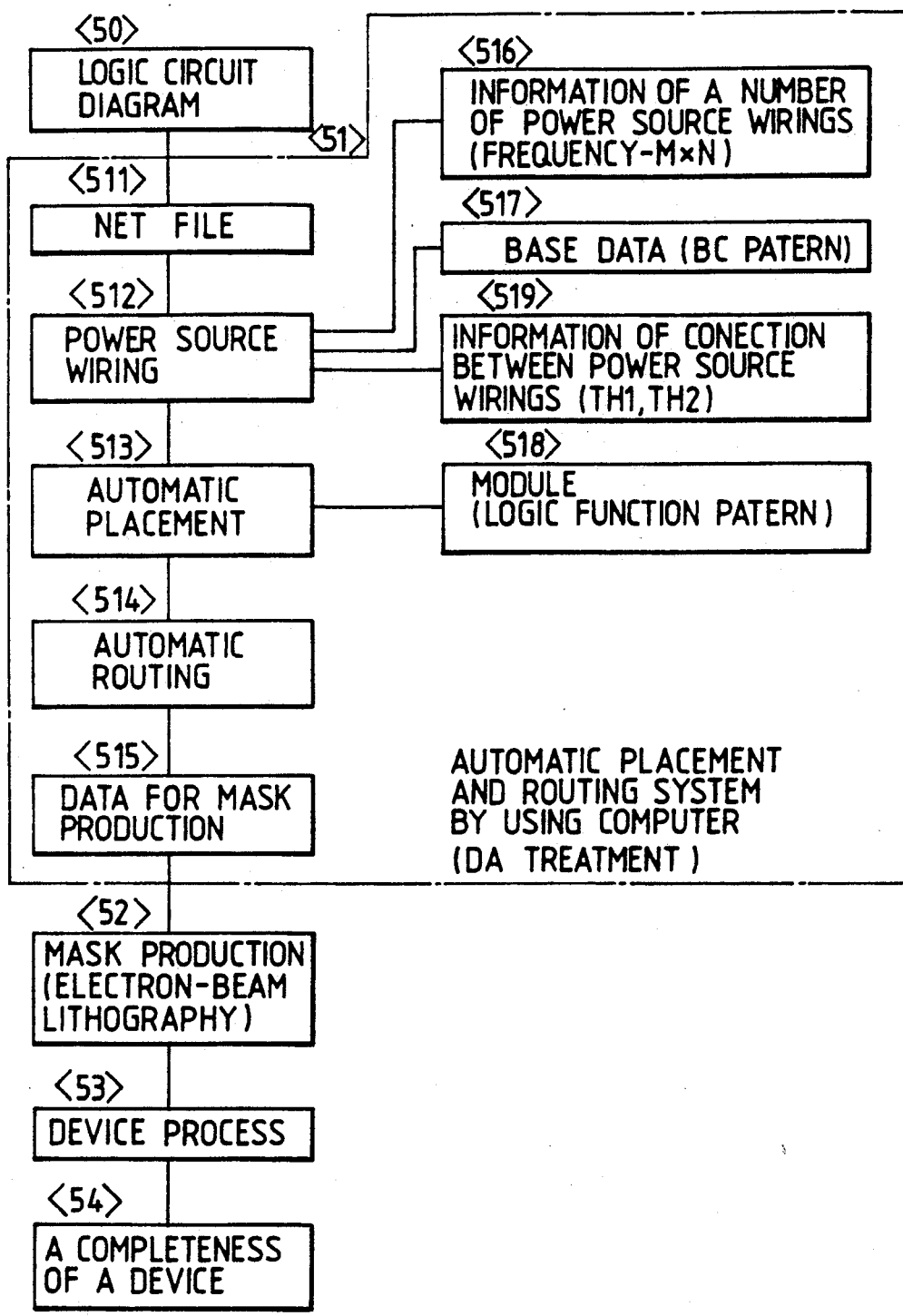
FIG. 6 is a process flow chart showing a production process of the semiconductor integrated circuit device.

Now, the production process of the semiconductor integrated circuit device of the present embodiment 1 will be described briefly with reference to FIG. 6 (process flow chart).

First, logics to be implemented on a semiconductor substrate 10 are designed and a corresponding logic diagram is made up 50. Then, layout and wiring of the logic circuits are automatically performed in an automatic placement and routing system (Design Automation, DA) using a computer base of the logic circuit diagram 51. In the automatic placement and routing system, first, routing information (net file) based on the logic circuit diagram is input to the automatic placement and routing system as wiring information which can be processed by the system <511>. Then, power source wirings are automatically arranged on a semiconductor substrate, which is stored in the base data <517> of the automatic placement and routing system and expressed symbolically <512>. The base data <517> is a set of information of a basic cell pattern arranged on the semiconductor substrate. The power source wirings, which are the auxiliary power source trunk lines (45, 46), are arranged according to information on the number of power source wirings <516>. More specifically, based on the chiefly used gate switching frequency and the wiring size as described above, the auxiliary power source trunk lines (45, 46) extended in the direction of the column at intervals of m basic cells and the auxiliary power source trunk lines (45, 46) extended in the direction of the row at intervals of n basic cells are arranged. In the automatic arrangement of the auxiliary power source trunk lines, the number of the wirings and the wiring size can be changed at will so that the current density in the region defined by the auxiliary power source trunk lines arranged in a lattice form can be optimally controlled, based according to the frequency and wiring size. The auxiliary power source trunk lines are arranged only within the cell region (20) because their arrangement is inhibited elsewhere. Of the power source wirings, the power source lines (5, 6, 15, and 16) and the cell power source lines (17 and 18) are stored as fixed patterns in the base data <517>.

Then, based on the net file input to the automatic placement and routing system, automatic placement of the designed logic circuits is performed <513>. The automatic placement of the logic circuits is executed by having modules (logic function patterns) <518> stored in the automatic placement and routing system automatically placed along the basic cell pattern.

Then, based on the net filed, the automatically placed logic circuits (modules) are automatically routed with signal wirings, whereby a set of logic circuit information is completed <514>. Then, based on design rules, the logic circuit information completed in the automatic placement and routing system is converted into data for mask production <515>. The processing from the inputting of the net filed in the step <511> to the completion of the data for mask production in the step <515> is automatically performed in the automatic placement and routing system.

Next, based on the data for mask production, masks for wirings (masks for production having the wiring patterns) are produced <52> with an electron beam (EB) delineator. Then, a device process is applied <53> onto the semiconductor wafer using the masks for wirings, and thereby, a semiconductor IC device with the prescribed logics implemented thereon is substantially completed.

In the production process of the semiconductor IC device in the master slice system using the automatic placement and routing system, as described above, the auxiliary power source trunk lines (45, 46) are automatically arranged for each of predetermined numbers of basic cells (11). This arrangement is based on the information of number of power source wirings <516> in the automatic placement and routing system <512>. The wiring patterns of the logic circuits are then automatically placed <513> and the logic circuits are automatically routed with signal wirings <514>. The result is that the auxiliary power source trunk lines (45, 46) are placed in advance such that the optimum current density is obtained. Thus, once the steps have been performed, this places the auxiliary power source trunk lines as fixed patterns on the base data in the automatic placement and routing system. Therefore, to have the logic circuits automatically routed, there is no need of performing the step to readjust the placement of the auxiliary power source trunk lines according to the current density of the specific regions. Hence, the steps in the automatic placement and routing process can be reduced and the period of development of the semiconductor integrated circuit device in the master slice system can be shortened accordingly.

As described in the foregoing summary, the following functional effects can be obtained from the present embodiment 1:

(1) The power source line 16 for the power source voltage $V_{cc}$ and the power source line 15 for the ground potential $V_{ss}$ are formed in the wiring layer on the lower layer (the second layer), and the power source line 6 for power source voltage $V_{cc}$ and power source line 5 for the ground potential $V_{ss}$ are formed on the upper layer (the third layer) such that these lines overlap each other. Therefore, as compared with the total line width in the prior art case where the power source line for the power source voltage $V_{cc}$ and the power source line for the ground potential $V_{ss}$ are both formed in a single wiring layer, the total line width of the power source lines 6 and 16 for the power source voltage $V_{cc}$ and the total line width of the power source line 5 and 15 for the ground potential $V_{ss}$ can be expanded up to a maximum corresponding to the total line width of both the power source lines formed in the same wiring layer in the prior art. Hence, the current density in the power source lines 5, 6, !5, and 16 can be reduced from that in the prior art and their EMD resistance can be improved accordingly.

(2) The EMD resistance can be improved over that in the prior art without expanding the total line width of the power source liens 6 and 16 for the power source voltage $V_{cc}$ or the total line width of the power source lines 5 and 15 for the ground potential $V_{ss}$ up to the total line width of the power source lines in the prior art as described in (1) above. In other words, the total line width of the power source lines 6 and 16 for the power source voltage $V_{cc}$ and the total line width of the power source lines 5 and 15 for the ground potential Vss, are each divided into two lines, and can therefore be made smaller than the total line width of the power source lines in the prior art. Accordingly, the area occupied by the power source lines 5, 6, 15, and 16 in the semiconductor integrated circuit device can be made smaller than that in the prior art and therefore the achievable cell density in the semiconductor IC device can be increased.

(3) By the arrangement such that the power source lines 5 and 6 and the power source lines 15 and 16 are arranged one above and overlapping the other, a large amount of coupling capacitance is produced between the two pair of power source lines. The power source lines having such large coupling capacitance are disposed directly above the I/O cells 13 and are connected with the I/O cells 13, and therefore, power source noises occurring as a result of switching operations made by a large number of the I/O cells 13 can be alleviated or absorbed. Thus, noise suppression characteristics of the semiconductor IC device produced in the master slice system can be improved so as to secure stabilized operation.

(4) The power source lines 6 and 15 located above the I/O cells 13 and toward the cell region 20 are arranged with one above and overlapping the other. Accordingly, the auxiliary power source trunk lines 46 and 45 respectively formed in the same wiring layers as the power source lines 6 and 15 are also arranged on the separate layers one above the other. Hence, it has become necessary to three-dimensionally cross the auxiliary power source trunk lines 46 and 45 to prevent their short-circuiting as practiced in the prior art. Thus, the degree of freedom in designing the auxiliary power source trunk lines 45 and 46 can be increased and the period of development of an IC device produced by a master slice system utilizing automatic placement and routing system can be shortened.

(5) By arranging, in addition to the arrangement described in (4) above, the power source line 16 for the power source voltage $V_{cc}$ and the power source line 15 for the ground potential $V_{ss}$ so as to be juxtaposed in the wiring layer on the lower layer (the second layer) of the power source lines of two-layer structure, power supply to the I/O cells 13 formed under the power source lines 15 and 16 can be easily realized.

As described in the above embodiment, the wirings within the I/O cell 13 and the wirings between the I/O cells 13 and the cell region 20 are chiefly formed in the wiring layer on the first layer. The power source line 15 for the ground potential $V_{ss}$ located above the I/O cells 13 and the auxiliary power source trunk lines 45 are formed in the wiring layer on the second layer, and the power source line 6 for the power source voltage $V_{cc}$ and the auxiliary power source trunk lines 46 are formed in the wiring layer on the third layer. Consequently, the degree of freedom employing the automatic placement and routing system can be increased and the period for development of the semiconductor IC device produced by the master slice system can be shortened.

Embodiment 2

Figure 7:
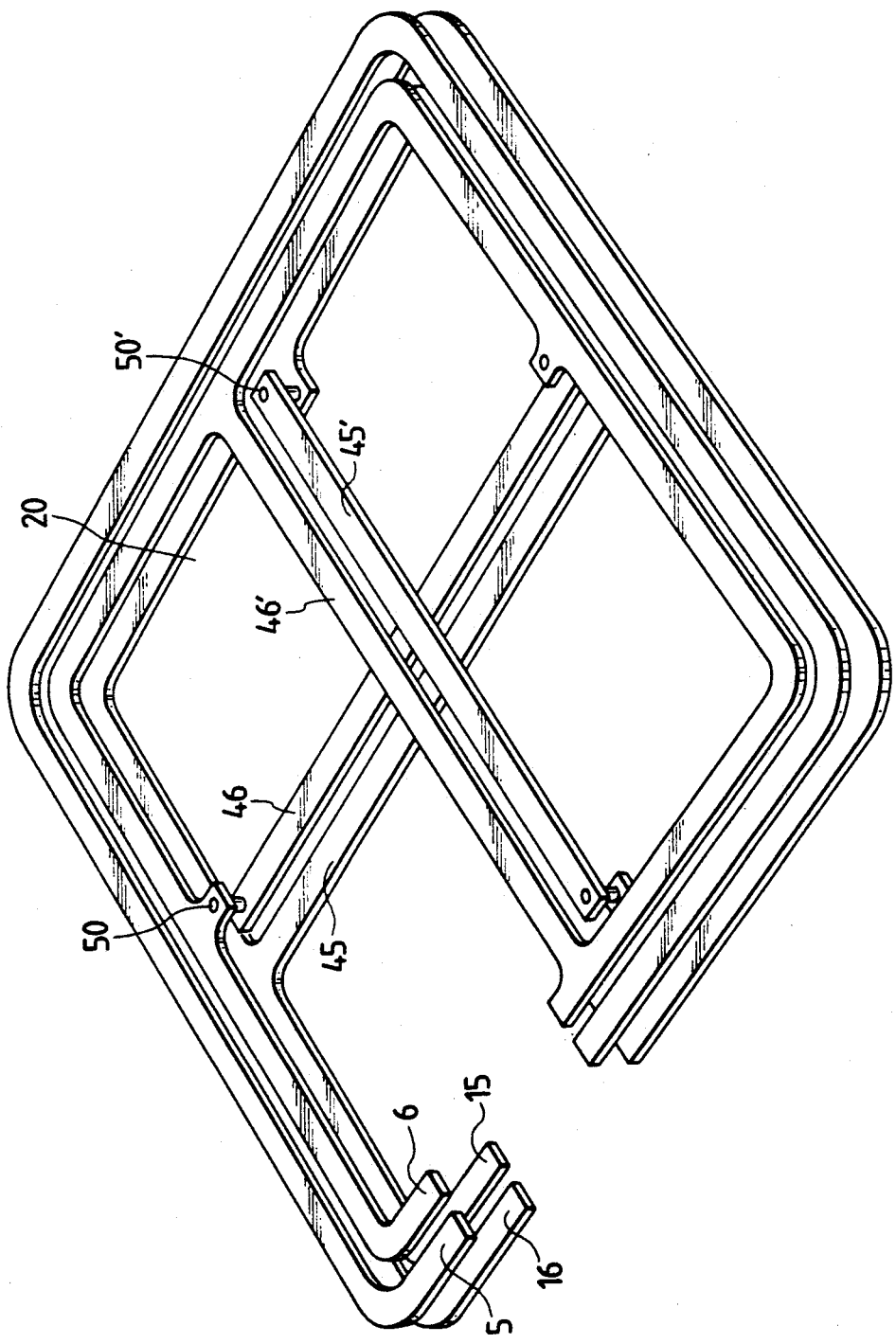
FIG. 7 is a schematic diagram showing another embodiment of the power source wirings according to the present invention.

FIG. 7 shows a second embodiment of the present invention. As with the first embodiment FIG. 1, the insulating films are not shown in this drawing. The difference between the embodiment 2 shown in this drawing from the embodiment 1 lies in the auxiliary power source trunk lines.

In the embodiment 1, the auxiliary power source trunk lines 45 and 46 are formed in separate layers, but in this embodiment 2, the pair are formed side by side in the same wiring layer. The auxiliary power source trunk lines 45 and 46 in one direction, longitudinal or lateral, and are formed side by side in the wiring layer on the second layer, and the auxiliary power source trunk lines 45' and 46', running in the direction to intersect with the auxiliary power source trunk lines 45 and 46 at right angles, are formed in the wiring layer on the third layer side by side. While the auxiliary power source trunk line 45 is connected at both of its ends with the power source line 15, the other auxiliary power source trunk line 46 formed in the same wiring layer is connected at both of its ends with the power source line 6 which is formed on the layer above it. The auxiliary power source trunk lines 46 and the power source line 6 are connected through a contact hole 50 made in an insulating layer, not shown, with the power source line 6 projected directly above the contact hole 50. Similarly, the auxiliary power source trunk line 46' is connected at both ends with the power source line 6, while the auxiliary power source trunk line 45' formed in the same wiring layer as line 46' is connected at both of its ends with the power source line 15 formed in the layer below it. The auxiliary power source trunk lines 45' and the power source line 15 are connected through a contact hole 50' made in an insulating film, not shown, with the power source line 15 projected directly below the contact hole 50'. Since the auxiliary power source trunk lines pairs 45, 46 and 45', 46' are formed on the different layers one below the other, no short-circuiting can occur at the crossing points in the lattice array. This eliminates the need for forming the auxiliary power source trunk lines at their crossing points in a three-dimensional arrangement as required in the prior art. Thereby, the design of the auxiliary power source trunk lines is simplified as in the embodiment 1. It should be noted that the power source lines 5, 6, 15, and 16 are continuous along the peripheral in a portion of fashion the substrate 10, and that some portions are cut away in the drawing only to show the situation of their being formed one above and overlapping the other. Also, connecting portions between the power source lines 5 and 15 and the connecting portion between the power source lines 6 and 16 are not shown.

According to the present embodiment 2, as in the embodiment 1, the benefits of improved EMD resistance of the power source lines 5, 6, 15, and 16 and simplified design of the auxiliary power source trunk lines 45, 46, 45', and 46' are obtained. However, it should be noted that there is a disadvantage in the embodiment 2 in that one of the pair of auxiliary power source trunk lines must be connected with its corresponding power source lines through a contact hole.

While the invention made by the present applicant has been described by its preferred embodiments, the present invention is not limited to the embodiments 1 and 2, and it is obvious that various changes of the invention are possible without departing from the spirit and scope thereof.

For example, although embodiments 1 and 2 show the power source lines being made of four lines, with two lines each for different potential formed in the same wiring layer, their arrangement is not limited as such. The power source lines can be formed, for example, of only two lines, each being formed on adjoining layers, one above and overlapping the other. In this case, some way must be devised to achieve electric connections with the I/O cells formed below the power source lines.

Furthermore, one pair of power source lines in the embodiments 1 and 2 have been described to be smaller in width than the power source lines formed in the same wiring layer in the prior art, but such design of the power source lines is not limitative. It is possible to arrange the lines such that two pair of power source lines, each having the same width as the power source line in the prior art are disposed with one above and overlapping the other. In this case, the EMD resistance will be even further improved, though the cell density will be substantially the same as in the prior art.

Furthermore, the power source lines are formed of aluminum alloy in the embodiments 1 and 2, but the material is not limited to this, and refractory metals such as tungsten and molybdenum, or silicide thereof may be suitably used.

Furthermore, the example gate array in the embodiments 1 and 2 is a sea-of-gates array, but this is not limitative. That of a fixed channel system may be applicable.

Furthermore, the source voltages supplied to the power source lines in the embodiments 1 and 2 have been the ground potential and a positive voltage with respect to the former, but this is not limitative. The latter may be a negative voltage, and further, the former may be a voltage other than the ground potential.

Still furthermore, the present invention has been described in the foregoing as to its application to a gate array system implemented on a semiconductor integrated circuit device. However, the application of the present invention is not limited to gate arrays. It can be widely applied to other semiconductor integrated circuit devices such as LSIs of the standard cell system. Actually the present invention is applicable to any semiconductor integrated circuit device which has a multilayer structure.

The effects obtained from the representative aspects of the invention disclosed herein will be summarized as follows:

(1) In a semiconductor integrated circuit device, by arranging a first power source wiring supplied with a first power source voltage and a second power source wiring supplied with a second power source voltage on separate adjoining layers one above the other, the width of the power source wiring can be made larger so that the current density in the power source wirings can be reduced and the EMD resistance of the power source wirings can be improved.

(2) By arranging the power source wirings such that they overlap each other, partially or wholly, the area occupied by the power source wirings can be reduced and, hence, the cell density in the semiconductor integrated circuit device can be increased.

(3) In a semiconductor integrated circuit device produced in a master slice system, short-circuiting at the crossing point of the power source wirings can be prevented without forming the power source wirings in a three-dimensional arrangement and the degree of freedom in designing the power source wirings can thereby be increased. Thus, the period for developing the semiconductor integrated circuit device produced in the master slice system using an automatic placement and routing system using an automatic placement and routing system can be shortened.

(4) By arranging the first power source wiring and second power source wiring such that they are disposed in adjoining two layers one above the other so as to overlap each other in parallel fashion, the coupling capacitance between the power source wirings is greatly increased compared to the coupling capacitance produced between the power source wirings arranged side by side on the same layer as done the prior art. This increased coupling capacitance alleviates or absorbs power source noises, malfunctions of the semiconductor integrated circuit device due to the power source noises can be prevented and electrical reliability of the device can be enhanced.

(5) Since the first power source wiring and a third power source wiring independently receiving different power source voltages are formed in the wiring layer on the lower layer, the power supply from the first and third power source wirings to the circuit elements thereunder becomes easy. Further the third power source wiring and a fourth power source wiring formed one below and overlapping the other are supplied with different power source voltages, and therefore the power supply to positions apart from the third and fourth power source wirings to the side is made easier.

What is claimed is:

1. A semiconductor device comprising:
a semiconductor substrate having a basic cell forming region formed on a principal surface of said semiconductor substrate;
first auxiliary power source means supplied with a first power source voltage and formed above said basic cell forming region with a first interlayer insulating film intervening therebetween; and
second auxiliary power source means supplied with a second power source voltage and formed above said first auxiliary power source means with a second interlayer insulating film intervening therebetween,
wherein said first auxiliary power source means supplies said basic cell forming region with the first power source voltage and said second auxiliary power source means supplies said basic cell forming region with the second power source voltage.

2. A semiconductor device according to claim 1, wherein each of said first auxiliary power source means and said second auxiliary power source means are arranged in a lattice form.

3. A semiconductor device according to claim 2, wherein said first auxiliary power source means and said second auxiliary power source means are arranged parallel with each other, and at different levels with respect to one another with a predetermined distance therebetween.

4. A semiconductor device according to claim 3, wherein said first auxiliary power source means comprises a first metal wiring layer and said second auxiliary power source means comprises a second metal wiring layer.

5. A semiconductor device according to claim 4, said semiconductor device further comprising:
basic cells formed in said basic cell forming region; and
a pair of cell power source wirings formed over each of said basic cells, wherein one of said cell power source wirings is connected with said first auxiliary power source means and the other of said cell power source wirings is connected with said second auxiliary power source means.

6. A semiconductor device according to claim 5, wherein said basic cell comprises a CMISFET.

7. A semiconductor device comprising:
a semiconductor substrate having a basic cell forming region and an input/output cell forming region, formed on a principal surface of said semiconductor substrate, said input/output cell forming region surrounding said basic cell forming region;
a first power source wiring supplied with a first power source voltage and formed and spaced above said input/output cell forming region;
first auxiliary power source wirings formed on the same level as said first power source wiring and extended over said basic cell forming region, said first auxiliary power source wirings being connected with said first power source wiring;
a second power source wiring supplied with a second power source voltage and formed and spaced above said first power source wiring; and
second auxiliary power source wirings formed on the same level as said second power source wiring and extended over said basic cell forming region, said second auxiliary power source wirings being connected with said second power source wiring.

8. A semiconductor device according to claim 7, wherein said first power source wiring and said first auxiliary power source wirings are formed integral and said second power source wiring and said second auxiliary power source wirings are formed integral.

9. A semiconductor device according to claim 8, wherein said first power source wiring and said second power source wiring are formed on adjoining separate levels one above the other and are arranged so as to overlap and parallel each other.

10. A semiconductor device according to claim 9, wherein, over said input/output cell forming region and in the same level as and juxtaposed with said first power source wiring, there is formed a third power source wiring, supplied with said second power source voltage, and in the same level as and juxtaposed with said second power source wiring there is formed a fourth power source wiring supplied with said first power source voltage, said third power source wiring and said fourth power source wiring being disposed one above the other so as to overlap and parallel each other.

11. A semiconductor device according to claim 10, wherein each of said first auxiliary power source wirings and said second auxiliary power source wirings are arranged in a lattice form.

12. A semiconductor device according to claim 11, wherein said first auxiliary power source wirings and said second auxiliary power source wirings are arranged parallel to each other and said first auxiliary power source wirings and said second auxiliary power source wirings are arranged at different levels with respect to each other with a predetermined distance therebetween.

13. A semiconductor device according to claim 12, wherein said first auxiliary power source wirings comprise a first metal wiring layer and said second auxiliary power source wirings comprise a second metal wiring layer.

14. A semiconductor device according to claim 13, said semiconductor device further comprising:
    basic cells formed in said basic cell forming region; and
    a pair of cell power source wirings formed over each of said basic cells, wherein one of said cell power source wirings is connected with said first auxiliary power source wirings and the other of said cell power source wirings is connected with said second auxiliary power source wirings.

15. A semiconductor device according to claim 14, wherein said basic cell comprises a CIMSFET.

16. A semiconductor device according to claim 7, wherein said first power source wiring and said second power source wiring comprise a first and second plurality of juxtaposed wirings respectively.

17. A semiconductor device according to claim 6, wherein said basic cells are arranged as an array.

18. A semiconductor device according to claim 17, wherein said basic cells are compactly arranged in said basic cell forming region.

19. A semiconductor device according to claim 18, wherein said pair of cell power wirings are formed of a metal wiring layer on a first layer below said second layer.

20. A semiconductor device according to claim 15, wherein said basic cells are arranged in array.

21. A semiconductor device according to claim 20, wherein said basic cells are compactly arranged in said basic cell forming region.

22. A semiconductor device according to claim 21, wherein said pair of cell power wirings are formed of a metal wiring layer on a first layer below said second layer.

* * * * *